(12) United States Patent
Cho et al.

(10) Patent No.: US 12,002,659 B2
(45) Date of Patent: Jun. 4, 2024

(54) APPARATUS FOR GENERATING ETCHANTS FOR REMOTE PLASMA PROCESSES

(71) Applicant: Applied Materials, Inc., Santa Clara, CA (US)

(72) Inventors: Tae Seung Cho, San Jose, CA (US); David Michael Benjaminson, Campbell, CA (US); Kenneth Schatz, Los Altos, CA (US); Ryan Michael Pakulski, Brentwood, CA (US); Martin Yue Choy, San Ramon, CA (US); Pratheep Gunaseelan, Fremont, CA (US); Chih-Yung Huang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 139 days.

(21) Appl. No.: 17/869,987

(22) Filed: Jul. 21, 2022

(65) Prior Publication Data
US 2023/0402262 A1 Dec. 14, 2023

Related U.S. Application Data

(60) Provisional application No. 63/351,645, filed on Jun. 13, 2022.

(51) Int. Cl.
*H01J 37/30* (2006.01)
*H01J 37/32* (2006.01)
(52) U.S. Cl.
CPC .. *H01J 37/32596* (2013.01); *H01J 37/32357* (2013.01); *H01J 37/3244* (2013.01)

(58) Field of Classification Search
CPC .... H01J 37/30; H01J 37/32009; H01J 37/321; H01J 37/32357; H01J 37/3244; H01J 37/32596; H01L 21/3065; H01L 21/67063
See application file for complete search history.

(56) References Cited

U.S. PATENT DOCUMENTS 9,117,855 B2  8/2015  Cho et al.
9,659,753 B2  5/2017  Cho et al.
(Continued)

OTHER PUBLICATIONS

PCT International Search Report and Written Opinion for PCT/US2022/046186 dated Mar. 9, 2023.

*Primary Examiner* — Jimmy T Vu
(74) *Attorney, Agent, or Firm* — Moser Taboa

(57) ABSTRACT

A remote plasma source (RPS) for generating etchants leverages symmetrical hallow cathode cavities to increase etchant rates. The RPS includes an upper electrode with a first hollow cavity configured to induce a hollow cathode effect within the first hollow cavity, a lower electrode with a second hollow cavity configured to induce a hollow cathode effect within the second hollow cavity, wherein the first hollow cavity and the second hollow cavity are symmetrical, a first gap positioned between and electrically separating the upper electrode and the lower electrode, and an annular dielectric cover in direct contact with the lower electrode in the first gap and forms a second gap between an uppermost surface of the annular dielectric cover and a lowermost surface of the upper electrode. The annular dielectric cover fills approximately 50% to approximately 95% of a height of the first gap.

20 Claims, 8 Drawing Sheets

(56) References Cited

U.S. PATENT DOCUMENTS

| | | |
|---|---|---|
| 9,773,648 B2 | 9/2017 | Cho et al. |
| 2010/0006226 A1 | 1/2010 | Cho et al. |
| 2014/0225502 A1 | 8/2014 | Kang et al. |
| 2015/0155189 A1* | 6/2015 | Cho ................. H01J 37/32541 |
| | | 438/731 |
| 2015/0332893 A1 | 11/2015 | Tabuchi et al. |
| 2015/0380218 A1 | 12/2015 | Tan et al. |
| 2016/0118223 A1 | 4/2016 | Agarwal et al. |
| 2016/0307739 A1 | 10/2016 | Lee et al. |
| 2021/0100089 A1 | 4/2021 | Daykin-Iliopoulos et al. |
| 2021/0384011 A1 | 12/2021 | Cho et al. |

\* cited by examiner

US 12,002,659 B2

APPARATUS FOR GENERATING ETCHANTS FOR REMOTE PLASMA PROCESSES

CROSS-REFERENCE TO RELATED APPLICATIONS

This application claims the benefit of U.S. provisional patent application Ser. No. 63/351,645, filed Jun. 13, 2022, which is herein incorporated by reference in its entirety.

FIELD

Embodiments of the present principles generally relate to semiconductor chambers used in semiconductor processes.

BACKGROUND

Some process chambers may include a remote plasma source (RPS) for forming plasma remotely from a process chamber into which the radicals and/or ionized species are to be delivered. Conventionally, the RPS is connected to the processing chamber through a mixing reservoir for mixing a process gas stream provided by the RPS with a dilutant (or carrier) gas or other fluids prior to delivery to the chamber. Ions or radicals may then be dispersed into a processing volume of the process chamber to perform processes such as etching or cleaning. An RPS may include an RF electrode with a hollow cavity and a ground electrode consisting of a flat grounding plate. The RF electrode with the hollow cavity creates a hollow cathode mode that enhances electron impact ionization within the hollow cavity. The ground electrode with the flat grounding plate produces a glow discharge mode. The inventors have observed that if a sinusoidal driving system is used for such an RPS, particles may be produced during the glow discharge mode that cause defects on the wafers being processed.

Thus, the inventors have provided improved apparatus to produce remote plasma with increased etch rates and reduced generation of particles.

SUMMARY

Apparatus for increased etch rates and the reduction of particle generation during remote plasma generation are provided herein.

In some embodiments, an apparatus for processing a substrate may comprise a process chamber with a chamber body enclosing a processing volume, a remote plasma source (RPS) having a plasma source with an upper electrode and a lower electrode, wherein the upper electrode and the lower electrode are symmetrical with hollow cavities configured to induce a hollow cathode effect within the hollow cavities, wherein the upper electrode and the lower electrode are electrically separated by a first gap with an annular dielectric cover positioned within the first gap, wherein the annular dielectric cover is in direct contact with the lower electrode and forms a second gap between an uppermost surface of the annular dielectric cover and a lowermost surface of the upper electrode, wherein the annular dielectric cover fills approximately 50% to approximately 95% of a height of the first gap, and wherein the RPS is configured to provide radicals or ions into the processing volume, and a radio frequency (RF) power source configured to provide a symmetrical driving waveform on the upper electrode and the lower electrode to produce an anodic cycle and a cathodic cycle of the RPS, wherein the anodic cycle and the cathodic cycle operate in a hollow cathode effect mode.

In some embodiments, the apparatus may further include wherein the annular dielectric cover is a ceramic material, wherein the annular dielectric cover has an outermost edge with a first thickness and an innermost edge with a second thickness less than the first thickness, wherein the second thickness is approximately 1 millimeter to approximately 2 millimeters and the first thickness is less than approximately 95% of the height of the first gap, wherein the first thickness slopes downward into a third thickness equal to the second thickness before reaching the innermost edge, wherein the annular dielectric cover has an inner diameter greater than an outer edge of an opening of the hollow cavities, wherein the annular dielectric cover has an inner diameter smaller than an outer edge of an opening of the hollow cavities and wherein an innermost edge of the annular dielectric cover extends, at least partially, into the opening, wherein capillary holes are spaced in proximity of the innermost edge of the annular dielectric cover, wherein the capillary holes have a diameter of less than two times a thickness of a sheath of plasma to be generated with the RPS, wherein the upper electrode and the lower electrode are plated with electroless nickel plating, wherein an yttria coating is applied to plasma exposed surfaces of the upper electrode and the lower electrode, and/or wherein an yttria coating is applied to plasma exposed surfaces with the first gap and in proximity of openings of the hollow cavities of the upper electrode and the lower electrode.

In some embodiments, an apparatus for processing a substrate may comprise a remote plasma source (RPS) having a plasma source with an upper electrode and a lower electrode, wherein the upper electrode and the lower electrode are symmetrical with hollow cavities configured to induce a hollow cathode effect within the hollow cavities, wherein the upper electrode and the lower electrode are electrically separated by a first gap with an annular dielectric cover positioned within the first gap, wherein the annular dielectric cover is in direct contact with the lower electrode and forms a second gap between an uppermost surface of the annular dielectric cover and a lowermost surface of the upper electrode, wherein the annular dielectric cover fills approximately 50% to approximately 95% of a height of the first gap, and wherein the RPS is configured to provide radicals or ions, and a radio frequency (RF) power source configured to provide a symmetrical driving waveform on the upper electrode and the lower electrode to produce an anodic cycle and a cathodic cycle of the RPS, wherein the anodic cycle and the cathodic cycle operate in a hollow cathode effect mode.

In some embodiments, the apparatus may further include wherein the annular dielectric cover has an outermost edge with a first thickness and an innermost edge with a second thickness less than the first thickness and wherein the second thickness is approximately 1 millimeter to approximately 2 millimeters and the first thickness is less than approximately 95% of the height of the first gap, wherein the first thickness slopes downward into a third thickness equal to the second thickness before reaching the innermost edge, wherein the annular dielectric cover has an inner diameter greater than an outer edge of an opening of the hollow cavities or wherein the annular dielectric cover has an inner diameter smaller than an outer edge of an opening of the hollow cavities and wherein an innermost edge of the annular dielectric cover extends, at least partially, into the opening, wherein capillary holes are spaced in proximity of the innermost edge of the annular dielectric cover and wherein the capillary holes have a diameter of less than two times a thickness of a sheath of plasma to be generated with the RPS, and/or wherein the upper electrode and the lower electrode are plated with electroless nickel plating and wherein an yttria coating is applied to plasma exposed surfaces of the upper electrode and the lower electrode on the electroless nickel plating.

In some embodiments, the apparatus for providing a remote plasma source (RPS) for generating etchants may comprise an upper electrode with a first hollow cavity configured to induce a hollow cathode effect within the first hollow cavity, a lower electrode with a second hollow cavity configured to induce a hollow cathode effect within the second hollow cavity, wherein the first hollow cavity and the second hollow cavity are symmetrical, a first gap positioned between and electrically separating the upper electrode and the lower electrode, and an annular dielectric cover in direct contact with the lower electrode in the first gap and forms a second gap between an uppermost surface of the annular dielectric cover and a lowermost surface of the upper electrode, wherein the annular dielectric cover fills approximately 50% to approximately 95% of a height of the first gap, wherein the annular dielectric cover has an inner diameter smaller than an outer edge of an opening of the second hollow cavity which extends, at least partially, into the opening while directly in contact with a surface of the second hollow cavity, and wherein capillary holes are spaced in proximity of an innermost edge of the annular dielectric cover and have a diameter of less than two times a thickness of a sheath of plasma to be generated with the RPS.

In some embodiments, the apparatus may further include wherein the upper electrode and the lower electrode are plated with electroless nickel plating and an yttria coating is applied to plasma exposed surfaces of the upper electrode and the lower electrode over the electroless nickel plating.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
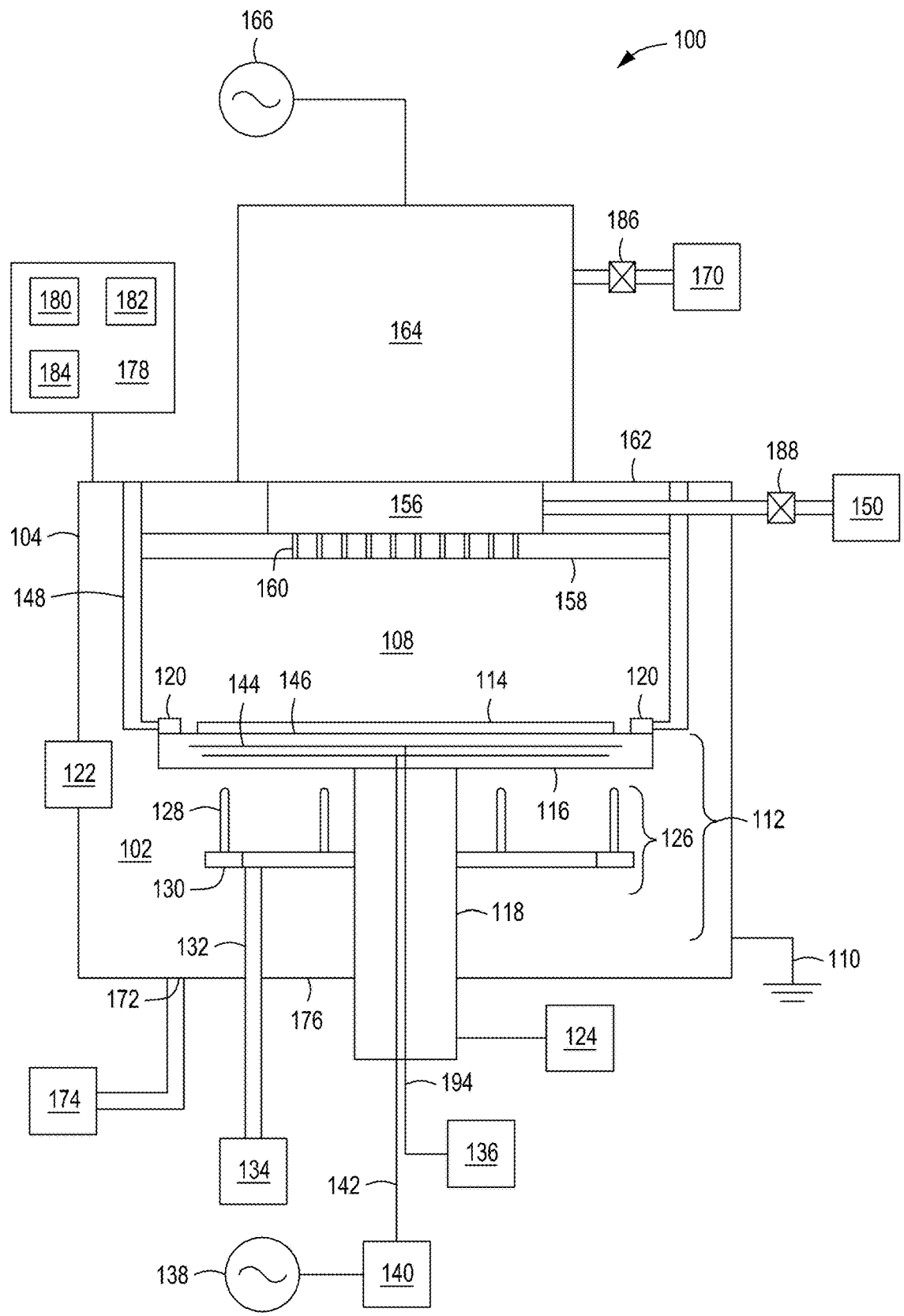
FIG. 1 depicts a cross-sectional view of a process chamber with a remote plasma source in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The apparatus provide an improved remote plasma source (RPS) with symmetrical hollow electrodes that produce hollow cathode effect modes for anodic and cathodic cycles of a symmetrical RF drive system. The improved RPS eliminates the glow discharge mode for anodic cycles found in typical RPS systems which causes particle generation in the process chamber, leading to wafer defects and lower wafer output. The methods and apparatus of the present principles use a symmetrical electrode configuration along with a symmetrical driving voltage waveform to generate the hollow cathode discharge modes. The symmetrical electrode and driving configuration enable higher power to be used without particle generation and higher etch rates. In addition, elimination of the glow discharge mode increases the lifetime of the RF system by preventing buildup on the gap surfaces between the electrodes. The symmetrical hollow cavity electrodes may be used with RF power systems with symmetrical driving waveforms with frequencies ranging from 10's of kilohertz to 100's of kilohertz to enable a hollow cathode effect mode for both the cathodic and the anodic cycles. The inventors found that the symmetrical waveform has the benefit of neutralizing charged particles that accumulate in a previous cycle. A symmetrical waveform may include, but is not limited to, a sinusoidal waveform or a square wave waveform and the like.

Some process chambers have an asymmetrical electrode configuration that gives two different discharge modes consisting of a hollow cathode mode and a glow discharge mode for cathodic and anodic cycles. The inventors found that the glow discharge mode causes particles to be generated from sputtering of the electrodes due to high energy ion bombardment. The generated particles may fall on a wafer and affect the performance of the semiconductor. Particle performance was found to be even worse for higher RF power, seriously limiting the throughput as the RF power must be reduced to increase particle performance and reduce particle generation. The inventors have discovered that the performance of symmetrical hollow cavity electrodes may be further improved by utilizing a ceramic cover that is placed over the bottom electrode and in the gap between the electrodes to increase the etching rate by enhancing the hollow cathode effect. In some embodiments, the dielectric (e.g., ceramic, etc.) cover and a dielectric (e.g., ceramic, etc.) isolator may be merged into a single unitary piece or assembly. In some embodiments, the inventors have discovered that a hybrid coating of electroless nickel plating (ENP) and yttria ($Y_2O_3$) on the electrodes and/or capillary holes on the dielectric cover may also be used to generate improved plasma (higher density) without any ignition failure. The use of a ceramic cover has the advantageous benefit of putting more power to the hollow cathode discharge region to substantially increase the etch rate.

Hollow cathode discharge plasma is more efficient in etchant generation than plasma generated in the gap area between the symmetrical hollow cavity electrodes. The inventors discovered that by covering the gap area between the electrodes with a dielectric material increases the impedance and helps to reduce the power loss that occurs in the gap. The dielectric material can be a thin ceramic, or thin film such as yttria and the like which also prevents any underlying electrode material, such as but not limited to, nickel and the like from sputtering during plasma generation. The inventors also found that covering the electrode with dielectrics makes the plasma ignition more difficult. To reduce the ignition failure, the shape of the dielectrics should be optimized. Capillary holes can be added to the cover or unitary assembly to help make plasma ignition easier.

The methods and apparatus may be used for different types of process chambers such as preclean chambers or etch chambers and the like. As an example chamber use, FIG. 1 depicts a cross-sectional view of a process chamber 100 with a remote plasma source 164 in accordance with some embodiments. The process chamber 100 is a vacuum chamber which is adapted to maintain sub-atmospheric pressures within an interior volume 102 during substrate processing. In some embodiments, the process chamber 100 can maintain a pressure of approximately 1 mTorr to 100 Torr. The process chamber 100 includes a chamber body 106 which encloses a processing volume 108 located in the upper half of the interior volume 102. The chamber body 104 may be made of metal, such as aluminum and the like. The chamber body 104 may be grounded via a coupling to ground 110.

A substrate support 112 is disposed within the interior volume 102 to support and retain a substrate 114, such as a semiconductor wafer, for example, or other such substrate. The substrate support 112 may generally comprise a pedestal 116 and a hollow support shaft 118 for supporting the pedestal 116. The pedestal 116 may be composed of an aluminum-based material or a ceramic-based material and the like. A pedestal formed of a ceramic-based material may be used for high temperature processes. The hollow support shaft 118 provides a conduit to provide, for example, backside gases, process gases, fluids, coolants, power, or the like, to the pedestal 116. In some embodiments, the substrate support 112 includes a focus ring 120 disposed about the pedestal 116 to enhance process uniformity at an edge of the substrate 114. In some embodiments, the focus ring 120 is made of quartz-based materials. In some embodiments, the focus ring 120 is made of ceramic-based materials. The ceramic-based material facilitates high pressure process capabilities. A slit valve 122 may be coupled to the chamber body 104 to facilitate in transferring the substrate 114 into and out of the interior volume 102.

In some embodiments, the hollow support shaft 118 is coupled to a lift actuator 124, such as a motor, which provides vertical movement of the pedestal 116 between an upper, processing position, and a lower, transfer position. A substrate lift 126 can include lift pins 128 mounted on a platform 130 connected to a shaft 132 which is coupled to a second lift actuator 134 for raising and lowering the substrate lift 126 so that the substrate 114 may be placed on or removed from the pedestal 116. The pedestal 116 may include through-holes to receive the lift pins 128. The hollow support shaft 118 provides a path for a gas conduit 194 for coupling a backside gas supply 136 and/or an RF power supply 138 to the pedestal 116. In some embodiments, the RF power supply 138 provides bias power through a matching network 140 to a power conduit 142 to the pedestal 116. In some embodiments, RF energy supplied by the RF power supply 138 may have a frequency of about 2 MHz or greater. In some embodiments, the RF power supply 138 may have a frequency of about 13.56 MHz.

In some embodiments, the backside gas supply 136 is disposed outside of the chamber body 104 and supplies gas to the pedestal 116. In some embodiments, the pedestal 116 includes a gas channel 144, allowing gas to interact with a backside of the substrate 114 to maintain a given temperature. The gas channel 144 is configured to provide backside gas, such as nitrogen (N), argon (Ar), or helium (He), to an upper surface 146 of the pedestal 116 to act as a heat transfer medium. The gas channel 144 is in fluid communication with the backside gas supply 136 via gas conduit 194 to control the temperature and/or temperature profile of the substrate 114 during use. For example, the backside gas supply 136 can supply gas to cool and/or heat the substrate 1114 during use. In some embodiments, the substrate 114 may be heated from approximately 60 degrees Celsius to approximately 450 degrees Celsius.

The process chamber 100 includes a process kit circumscribing various chamber components to prevent unwanted reaction between such components and contaminants. The process kit includes an upper shield 148. In some embodiments, the upper shield 148 may be made of metal, such as aluminum. In some embodiments, the process kit may be constructed of quartz. In some embodiments, a mixing reservoir 156 is coupled to and in fluid communication with the processing volume 108. The mixing reservoir 156 is also fluidly connected to the RPS 164. The mixing reservoir 156 allows mixing of the plasma gases with other gases provided by a gas delivery system 150. A rate of flow of the other gases from the gas delivery system 150 may be controlled by a first flow valve 188.

A showerhead 158 is located above the processing volume 108 and below a ceiling 162 of the chamber body 104. The showerhead 158 includes through-holes 160 to flow gases from the mixing reservoir 156 into the processing volume 108. The RPS 164 is fluidly connected to the mixing reservoir 156 to allow ionized gases to flow from the RPS 164 into the mixing reservoir 156, through the showerhead 158, and into the processing volume 108. Plasma is generated in the RPS 164 by a plasma RF power source 166 that provides RF energy to the RPS 164. Process gases used to form the plasma are supplied by a process gas source 170 and controlled by a second flow valve 186. The plasma gases supplied by the process gas source 170 may include, but are not limited to, hydrogen, helium, and/or argon and the like. The RPS 164 produces ions and radicals of the process gas to facilitate in processing the substrate 114.

A pump port 172 is configured to facilitate removal of particles and gases from the interior volume 102. The process chamber 100 is coupled to and in fluid communication with a vacuum system 174 which includes a throttle valve (not shown) and pump (not shown) which are used to exhaust the process chamber 100. In some embodiments, the vacuum system 174 is coupled to the pump port 172 disposed on a bottom surface 176 of the chamber body 104. The pressure inside the process chamber 100 may be regulated by adjusting the throttle valve and/or vacuum pump. In some embodiments, the pump has a flow rate of approximately 1900 liters per second to approximately 3000 liters per second. In some embodiments, the vacuum system 174 may be used to facilitate in regulating the substrate temperature.

In some embodiments, a controller 178 is used for the operation of the process chamber 100. The controller 178 may use direct control of the process chamber 100 or alternatively, use indirect control of the process chamber 100 by controlling computers (or controllers) associated with the process chamber 100. In operation, the controller 178 enables data collection and feedback from the process chamber 100 to optimize performance of the process chamber 100. The controller 178 generally includes a Central Processing Unit (CPU) 180, a memory 182, and a support circuit 184. The CPU 180 may be any form of a general-purpose computer processor that can be used in an industrial setting. The support circuit 184 is conventionally coupled to the CPU 180 and may comprise a cache, clock circuits, input/output subsystems, power supplies, and the like. Software routines, such as a method as described below may be stored in the memory 182 and, when executed by the CPU 180, transform the CPU 180 into a specific purpose computer (controller 178). The software routines may also be stored and/or executed by a second controller (not shown) that is located remotely from the process chamber 100.

The memory 182 is in the form of computer-readable storage media that contains instructions, when executed by the CPU 180, to facilitate the operation of the semiconductor processes and equipment. The instructions in the memory 182 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
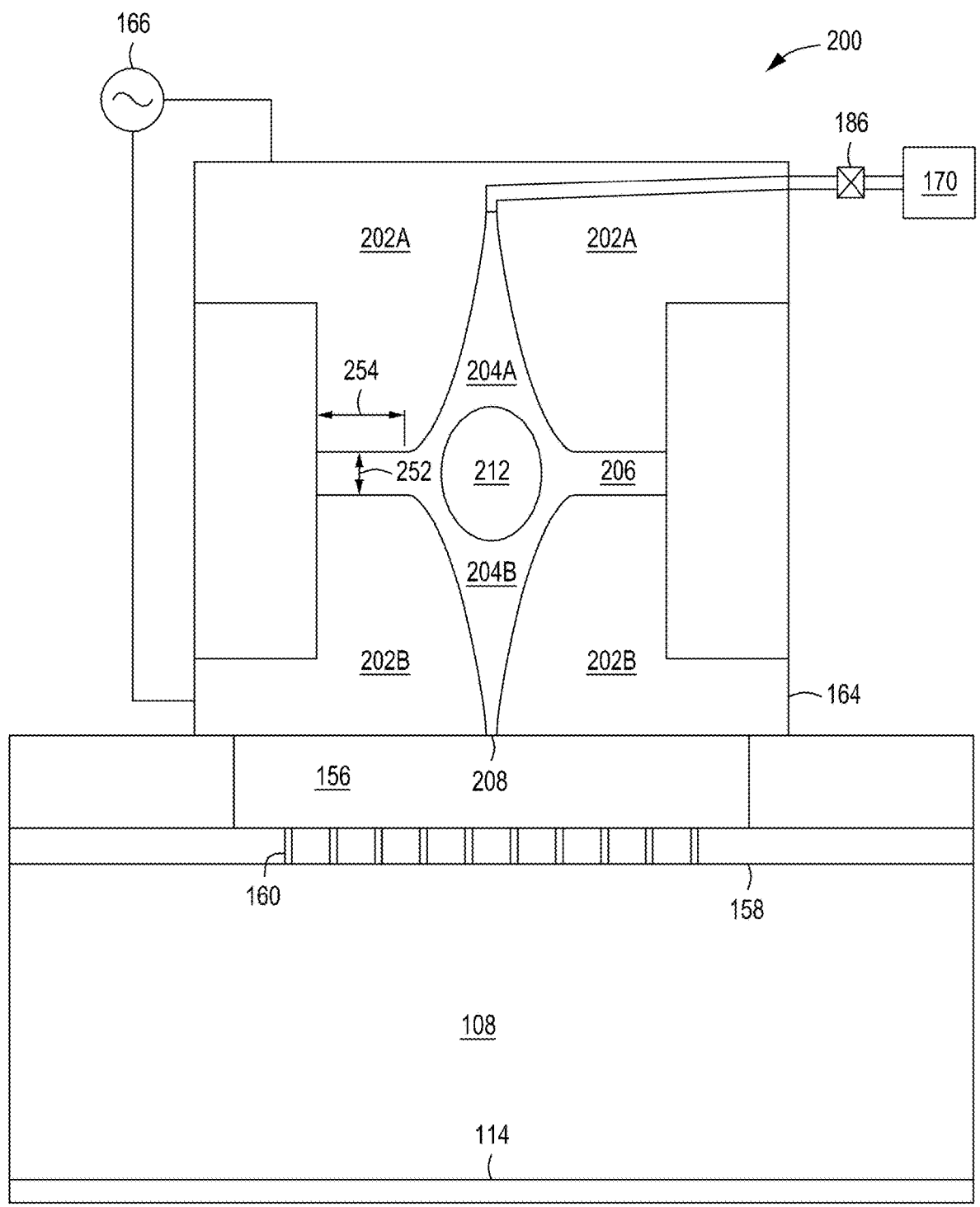
FIG. 2 depicts a cross-sectional view of a plasma source with symmetric electrodes in accordance with some embodiments of the present principles.
Figure 13:
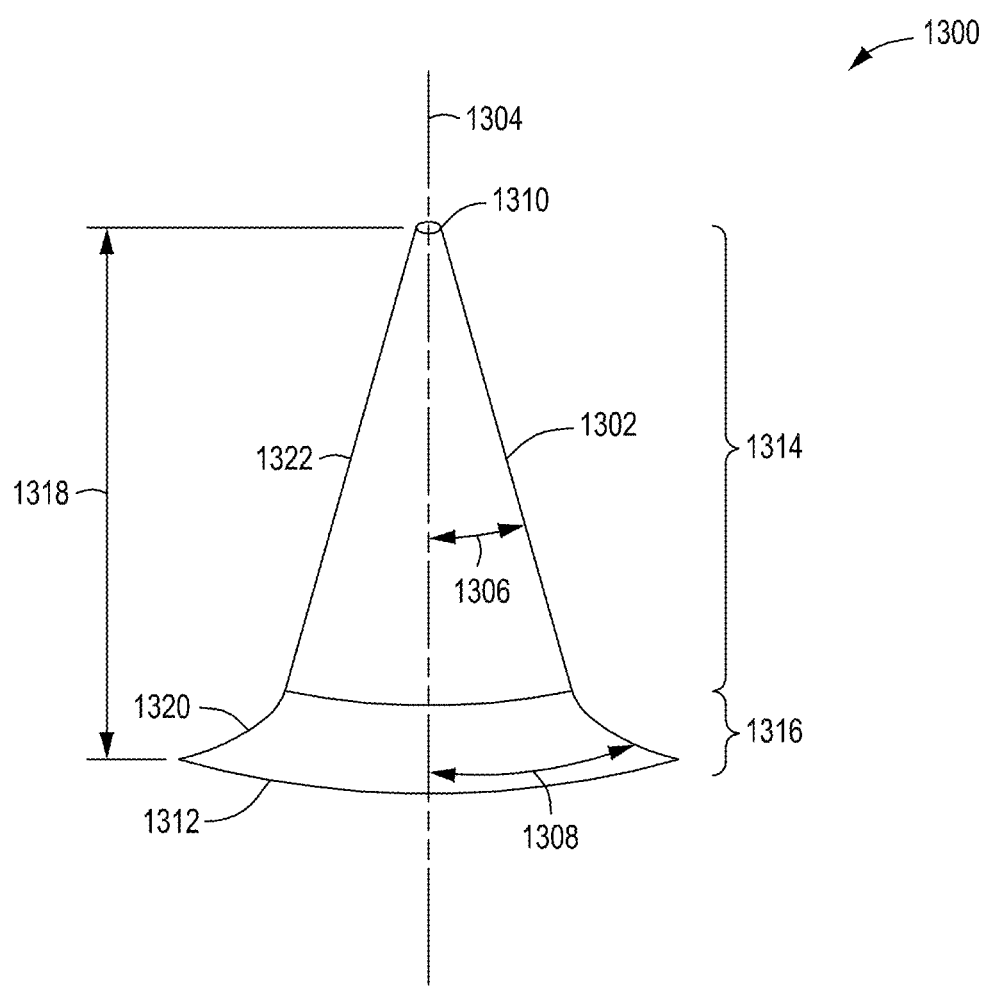
FIG. 13 depicts a hollow cathode effect cavity in accordance with some embodiments of the present principles.

FIG. 2 depicts a cross-sectional view of a plasma source 200 with an upper symmetric electrode 202A and a lower symmetric electrode 202B in accordance with some embodiments. During operation of the RPS 164, gas enters a gas port 210 and plasma related products exit through a diffuser hole 208 into the mixing reservoir 156. The diffuser hole 208 may have a diameter of approximately 0.1 inches to approximately 0.2 inches. The upper symmetric electrode 202A and the lower symmetric electrode 202B have a respective upper symmetrical hollow cavity 204A and a respective lower symmetrical hollow cavity 204B that are configured to produce a hollow cathode effect. The upper symmetric electrode 202A and the lower symmetric electrode 202B are separated by a gap 206. The gap 206 is an annular shaped area and electrically separates the upper symmetric electrode 202A and the lower symmetric electrode 202B by a height 252 of approximately 0.2 inches to approximately 0.5 inches. The gap 206 has a width 254 that is defined by the distance that the upper symmetric electrode 202A and the lower symmetric electrode 202B remain parallel to each other. The upper symmetrical hollow cavity 204A and the lower symmetrical hollow cavity 204B have a cone shape 1302 as illustrated in the isometric view of FIG. 13. FIG. 13 depicts a hollow cathode effect cavity 1300 in accordance with some embodiments.

In FIG. 13, the cone shape 1302 has a vertical axis 1304 in at a center. At a first end 1310 is an opening to fluidly connect with a gas supply (e.g., process gas source 170). The opening at the first end 1310 may have a diameter of approximately 0.1 inches to approximately 0.2 inches. At a second end 1312 is a larger flared opening that fluidly connects with the gap 206 between the upper symmetric electrode 202A and the lower symmetric electrode 202B. In some embodiments, the cone shape 1302 may have a first cone section 1314 with a first angle 1306 of approximately 5 degrees to approximately 30 degrees. The inventors have found that a smaller angle (e.g., less than approximately 10 degrees) helps to increase the etch rate by promoting a denser plasma formation in the hollow cavities. In some embodiments, the first cone section 1314 has a first angle 1306 of approximately 8 degrees. In some embodiments, the cone shape 1302 may have a second cone section 1316 that has a larger flared opening or rounding with a second angle 1308 of approximately 10 degrees to approximately 60 degrees. The second cone section 1316 smoothly blends the first cone section 1314 into the gap area between the upper symmetric electrode 202A and the lower symmetric electrode 202B. In some embodiments, a height 1318 of the cone shape 1302 may be approximately 1.5 inches to approximately 2 inches.

Figure 12:
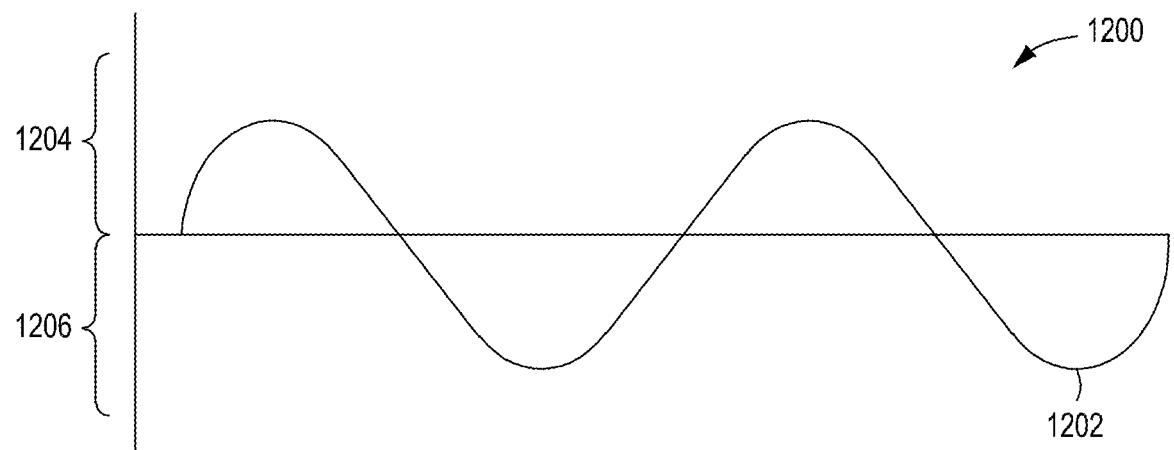
FIG. 12 depicts a graph of a symmetric driving waveform in accordance with some embodiments of the present principles.

The plasma RF power source 166 produces a symmetric driving waveform 1202 (e.g., a sinusoidal waveform is shown as a non-limiting example) as depicted in a graph 1200 of FIG. 12. During a cathodic period 1206, a hollow cathode mode caused by the upper symmetrical hollow cavity 204A forms plasma 212. During an anodic period 1204, a hollow cathode mode caused by the lower symmetrical hollow cavity 204B forms plasma 212. In conventional systems with a grounding plate for the lower electrode, the anodic period 1204 would instead produce a glow discharge mode due to the grounding plate, generating particles that would be detrimental to semiconductor performance. With the upper symmetric electrode 202A and the lower symmetric electrode 202B of the present principles, the particle performance is substantially increased. During testing, the inventors found that when the upper symmetrical hollow cavity 204A and the lower symmetrical hollow cavity 204B are configured to produce a hollow cathode effect, the RPS 164 had superior particle performance compared to an RPS with parallel flat plane electrodes that produced a glow discharge for both the anodic and cathodic periods of the symmetric driving waveform 1202.

During testing, the inventors found that when a top electrode with a hollow cavity and a bottom electrode that is a plate electrode is used as ground (i.e., "asymmetrical electrodes"), two different plasma modes were generated when the plasma source was driven with a symmetrical waveform. During the anodic period 1204, a thin plasma is formed right on top of the plate electrode used as the ground. During the cathodic period 1206, a strong hollow cathode effect occurs at the center of the hollow cavity of the top electrode forming plasma at the center ("hollow cathode effect"). The inventors found that the hollow cathode mode improved etch performance. When the driving waveform was changed such that only cathodic periods were present (half sinusoidal waveform), the inventors found an improved etch performance but also found a negative side effect of a buildup of material within the gap separating the top and bottom electrodes of the plasma source.

Figure 3:
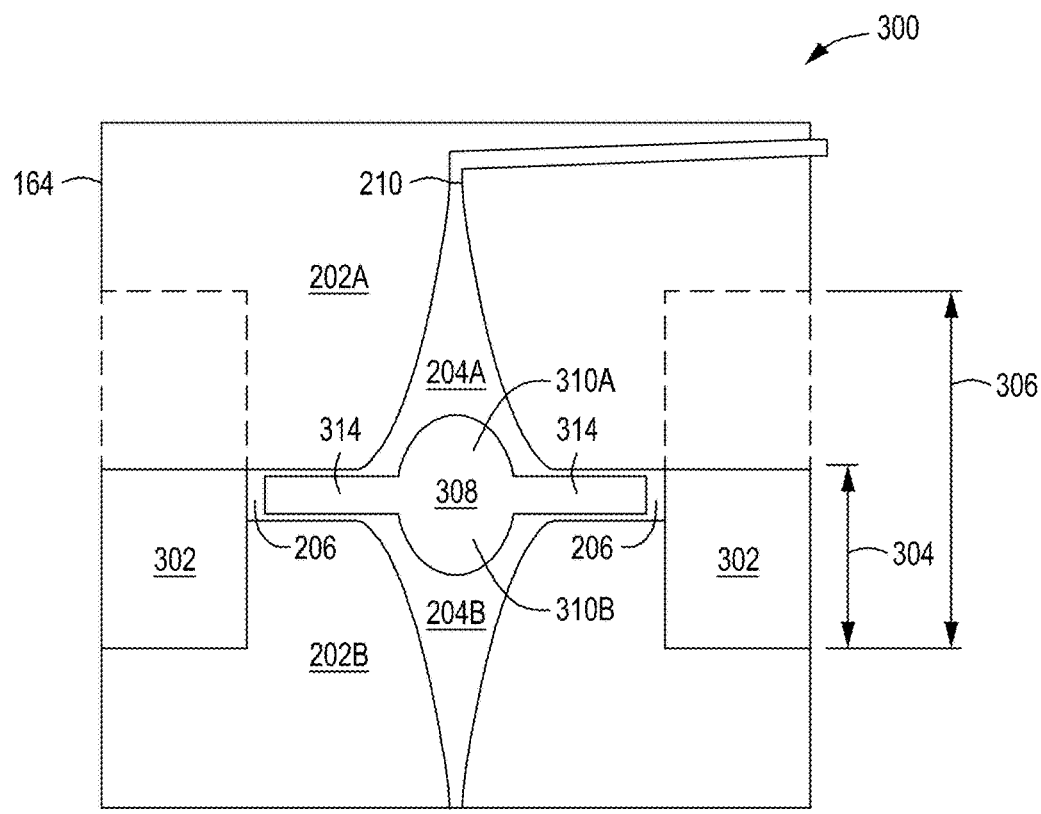
FIG. 3 depicts a cross-sectional view of a plasma source with symmetric electrodes and plasma generation in accordance with some embodiments of the present principles.

When the electrodes were changed to parallel flat electrodes with a gap between, a glow discharge mode was created for both anodic and cathodic periods, resulting in a decrease of etch performance and generation of a substantial number of particles. The inventors discovered that using symmetric electrodes with hollow cavities configured to create hollow cathode effect modes for anodic and cathodic periods improved the etch performance substantially over a single cone shaped hollow electrode. The improved etch rate was a result of the increased plasma portion 310A of the plasma 308 formed in the upper symmetrical hollow cavity 204A and the increased plasma portion 310B of the plasma 308 formed in the lower symmetric cavity 204B as depicted in a view 300 of FIG. 3. The increased plasma produced an approximately 20% increase in etch rate over single hallow cavity designs. An annular isolator 302 may surround the symmetrical hollow cavities to isolate the electrodes and provide the gap 206 between the symmetric electrodes 202A, 202B. In some embodiments, the annular isolator 302 may be positioned over a lower or upper symmetric electrode (FIG. 3 depicts the annular isolator 302 over the lower electrode with a thickness 304). In some embodiments, the annular isolator 302 may extend and surround both the lower and upper electrodes as denoted in FIG. 3 by an increased thickness 306. The greater thickness 306 offers a substantially reduced capacitance between the upper and lower electrodes due to the increased distance between the upper and lower electrodes compared to thickness 304.

Although the etch rate increased over a single hollow cavity design, the inventors found that a large percentage of the plasma 308 extended 314 into and filled the gap 206 between the upper symmetric electrode 202A and the lower symmetric electrode 202B as depicted in FIG. 3. The inventors discovered that by reducing the strength of the electric fields across the gap 206, more of the power supplied to the electrodes is available to the hollow cavity regions. In some embodiments as depicted in a view 400 of FIG. 4, a cover 402 formed of dielectric material is positioned over the lower symmetric electrode 202B or the upper symmetric electrode 202A to reduce the electric field strength in the gap 206, resulting in plasma 408 that is substantially increased in the hollow cavity regions. In some embodiments, the covers were formed of a ceramic material. The inventors found that using such a configuration gave up to an approximately three-fold (300%) increase in etch rates over symmetrical hollow cavity electrodes without a cover over one of the symmetric electrodes.

Figure 4:
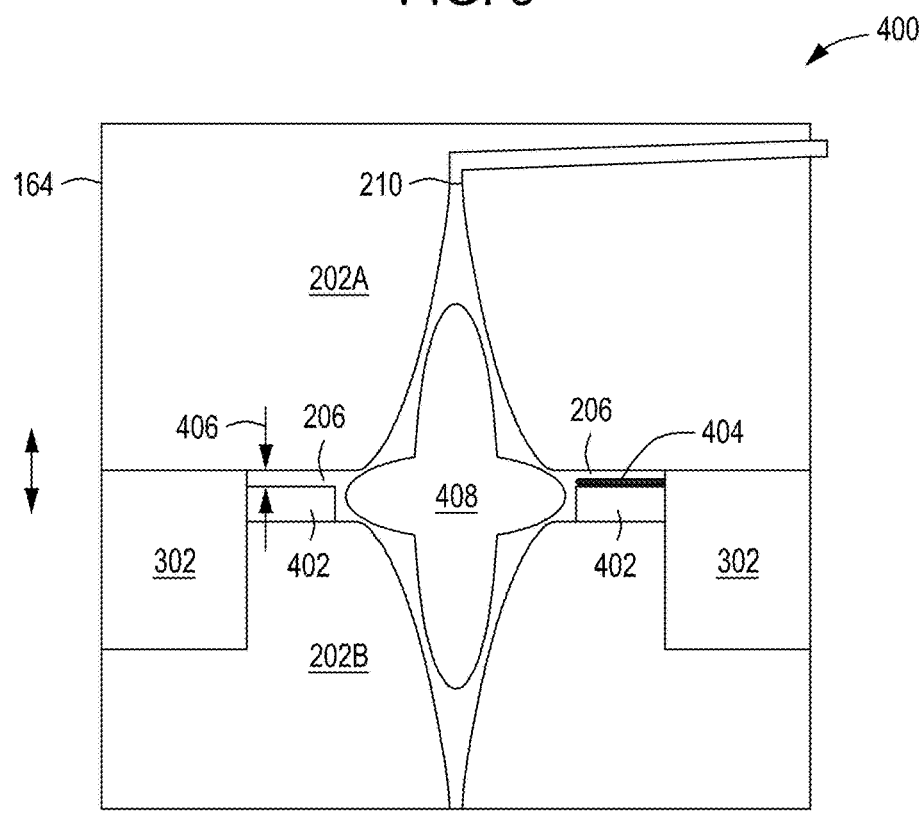
FIG. 4 depicts a cross-sectional view of a plasma source with symmetric electrodes and a cover in accordance with some embodiments of the present principles.
Figure 5:
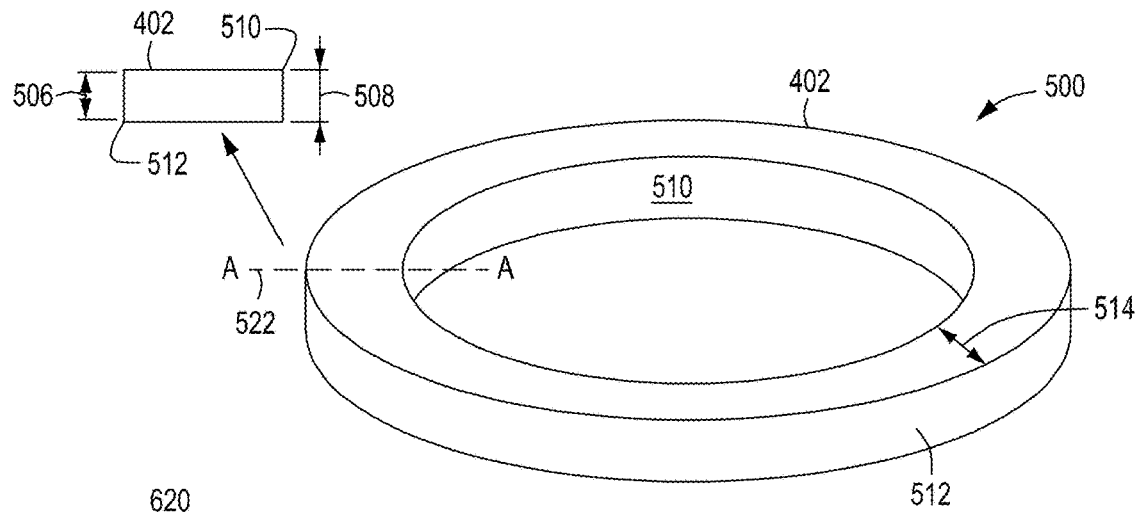
FIG. 5 depicts an isometric view of a cover for a remote plasma source in accordance with some embodiments of the present principles.

FIG. 5 depicts a view 500 of the cover 402 (as shown in FIG. 4 also) with a rectangular cross-section. The cover 402 is annular in shape and is positioned in the gap 206 between the upper symmetric electrode 202A and the lower symmetric electrode 202B. The cover 402, and all covers described herein, are defined as annular dielectric materials that fill the gap 206 with dielectric material from approximately 5% of the height 252 of the gap 206 to approximately 95% of the height 252 of the gap 206 (See, FIG. 2). The covers discussed herein do not completely fill the gap 206 (from the bottom electrode surface to the top electrode surface) in order to provide a space 406 to allow for the buildup 404 of process residue. When the electrodes are composed of nickel materials, the nickel materials will often sputter during processing and the re-sputtered nickel particles will cause buildup 404 on the surface of the covers. Leaving a space 406 between the covers and one or more electrodes allows for particle buildup, increasing the time between maintenance intervals for the RPS. In addition, the space 406, while increasing maintenance intervals, also prevents shorting or arcing from occurring when a metal residue such as re-sputtered nickel shorts or comes into close contact with both of the electrodes in the RPS.

The width 514 of the cover 402 may cover from approximately 80% to approximately 100% of the width 254 of the gap 206. As can be seen in FIG. 5, the cutline A-A 522 results in a rectangular cross-section with an outer edge 512 of a first thickness 506 and an inner edge 510 with a second thickness 508 equal to the first thickness 506. In some embodiments, the first thickness 506 may be approximately 80% to 95% of the height 252 of the gap 206. During testing, the inventors found that if the inner edge 510 of the cover 402 is the same thickness as the outer edge 512 of the cover, igniting plasma within the hollow cavities becomes problematic. The lower electric field strength near the hollow cavities produced weak plasma ignition and often failed to ignite the plasma to a sustainable level.

Figure 6:
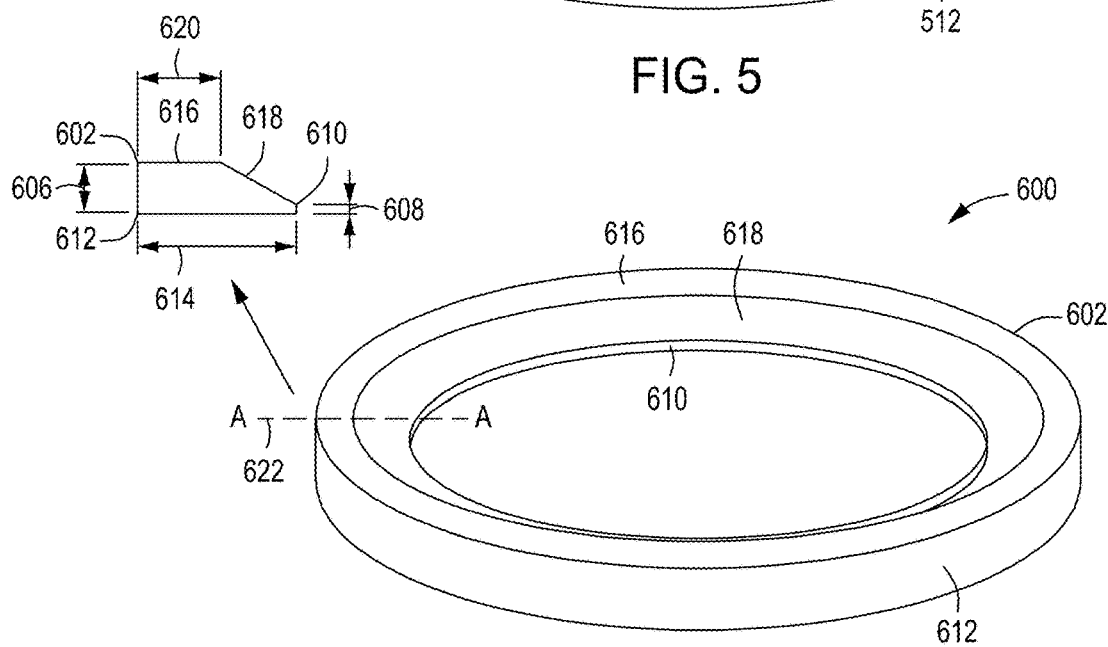
FIG. 6 depicts an isometric view of a cover with an angled surface for a remote plasma source in accordance with some embodiments of the present principles.

In a view 600 of FIG. 6, a cover 602 with an inner edge 610 with a reduced second thickness 608 is depicted. The second thickness 608 of the inner edge 610 may be approximately 5% to approximately 50% of the first thickness 606 of the outer edge 612 and a top surface 616. In some embodiments, the second thickness 608 may be from approximately 1 mm to approximately 2 mm. The inventors have found that while the second thickness 608 is desired to be as thin as possible to promote easier plasma ignition, the cover 602 is composed of a ceramic material, and the structural integrity of the cover 602 may dictate how thin the ceramic material can be made for a given RPS. If the second thickness 608 is too thick, plasma in the hollow cavities is enhanced but ignition of the plasma becomes very difficult or impossible. A width 614 of the cover 602 may be altered or remain unchanged compared to the width 514 of the cover 402.

Figure 7:
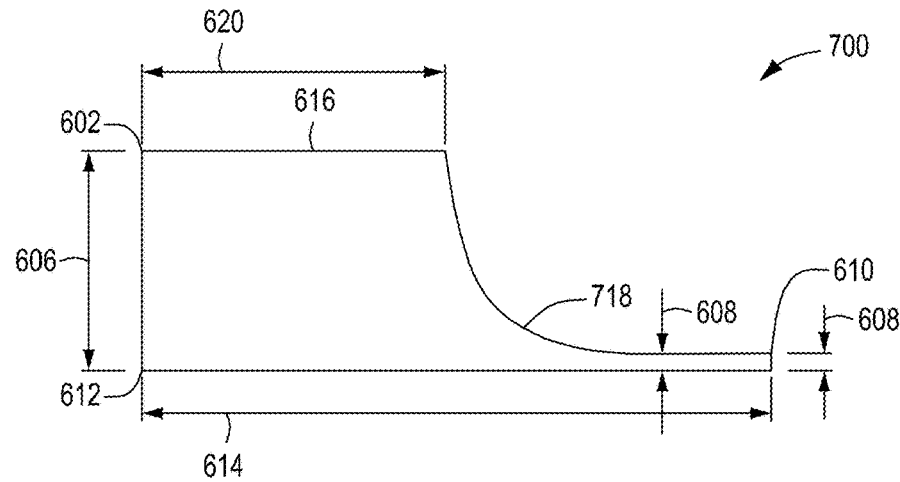
FIG. 7 depicts a cross-sectional view of a cover profile with a sloping surface for a remote plasma source in accordance with some embodiments of the present principles.

The altered profile of the cover 602 is shown at cutline AA 622. The width 620 of the top surface 616 may extend from approximately 30% to approximately 80% of the width 614 of the cover 602 before the angled surface 618 starts. The inventors found that the thinner inner edge 610 of the cover 602 provided enhanced performance for igniting plasma while still providing increased plasma in the symmetrical hollow cavities (e.g., etch rate performance remained high). In a view 700 of FIG. 7, another profile along the outline AA 622 is depicted with an altered angled surface 718. The angled surface 718 has a much sharper initial angle and then slopes down to the second thickness 608 from the first thickness 606. The altered angled surface 718 produces a larger area for increased electrical field strength (thinner portion area is larger and has higher electrical field strength than the profile of the cover of FIG. 6) to ignite plasma while still providing reduced electrical field strength for generating plasma mostly in the upper and lower symmetric electrodes. One skilled in the art can appreciate that other angled surfaces and shapes of the cover profile can provide sufficient plasma ignition while generating most plasma within the upper and lower symmetric electrodes.

Figure 8:
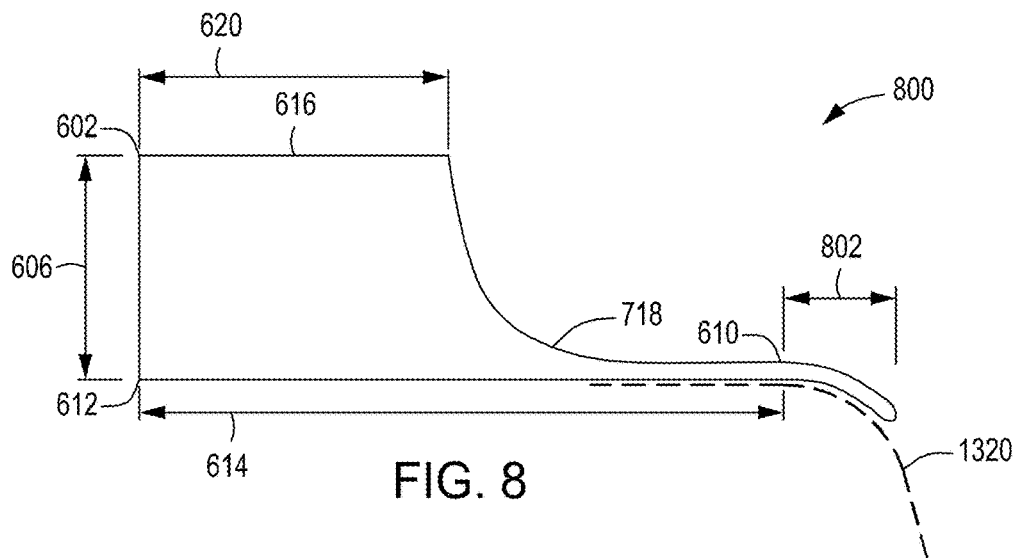
FIG. 8 depicts a cross-sectional view of a cover profile with a sloping surface and an extension for a remote plasma source in accordance with some embodiments of the present principles.
Figure 9:
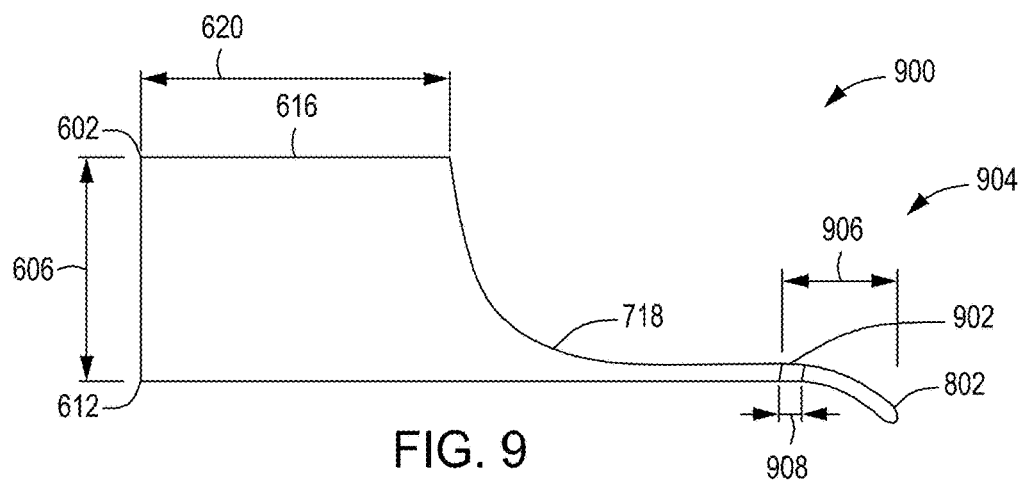
FIG. 9 depicts a cross-sectional view of a cover profile with a sloping surface and an extension with capillary holes for a remote plasma source in accordance with some embodiments of the present principles.

The inventors found that the plasma within the symmetric electrodes can be further enhanced by adding an extension 802 to the cover 602 that extends the cover 602 further into the mouth or the second cone section 1316 (see, e.g., FIG. 13) of at least the lower symmetric hollow cavity of the lower symmetric electrode as depicted in a view 800 of FIG. 8. The extension 802 follows the contours of the surface 1320 of the second cone section 1316. The extension 802 further enhances the plasma within the symmetric electrodes but makes ignition of the plasma more difficult. The inventors discovered that if capillary holes 902 were positioned equally spaced around the inner edge 904 of the cover 602 with the extension 802 as depicted in a view 900 of FIG. 9, the ignition of the plasma was substantially enhanced while maintaining the higher performing plasma within the symmetrical hollow cavities of the symmetric electrodes. The capillary holes 902 expose the top surface of the lower symmetric electrode so that increased electrical field strength at the exposed locations enables easier plasma ignition. If the capillary holes 902 have a diameter 908 of less than 2 times the sheath thickness of the plasma, the plasma can be easily ignited due to the exposed electrode surface through the capillary holes 902, but will be unable to maintain plasma through the capillary holes 902, as the plasma sheath is too thick to allow plasma to form in the capillary holes 902 (the plasma sheath would need to bend into the capillary holes and that would require a hole with a diameter of two times the thickness of the sheath or greater to maintain plasma within the holes).

Figure 10:
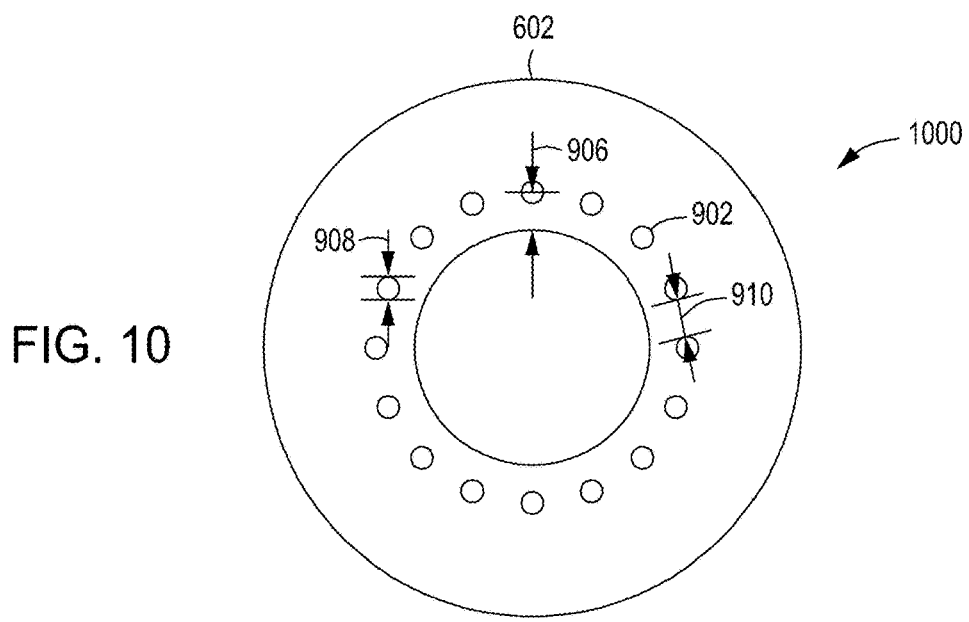
FIG. 10 depicts a bottom-up view of a cover with a sloping surface and an extension with capillary holes for a remote plasma source in accordance with some embodiments of the present principles.
Figure 14:
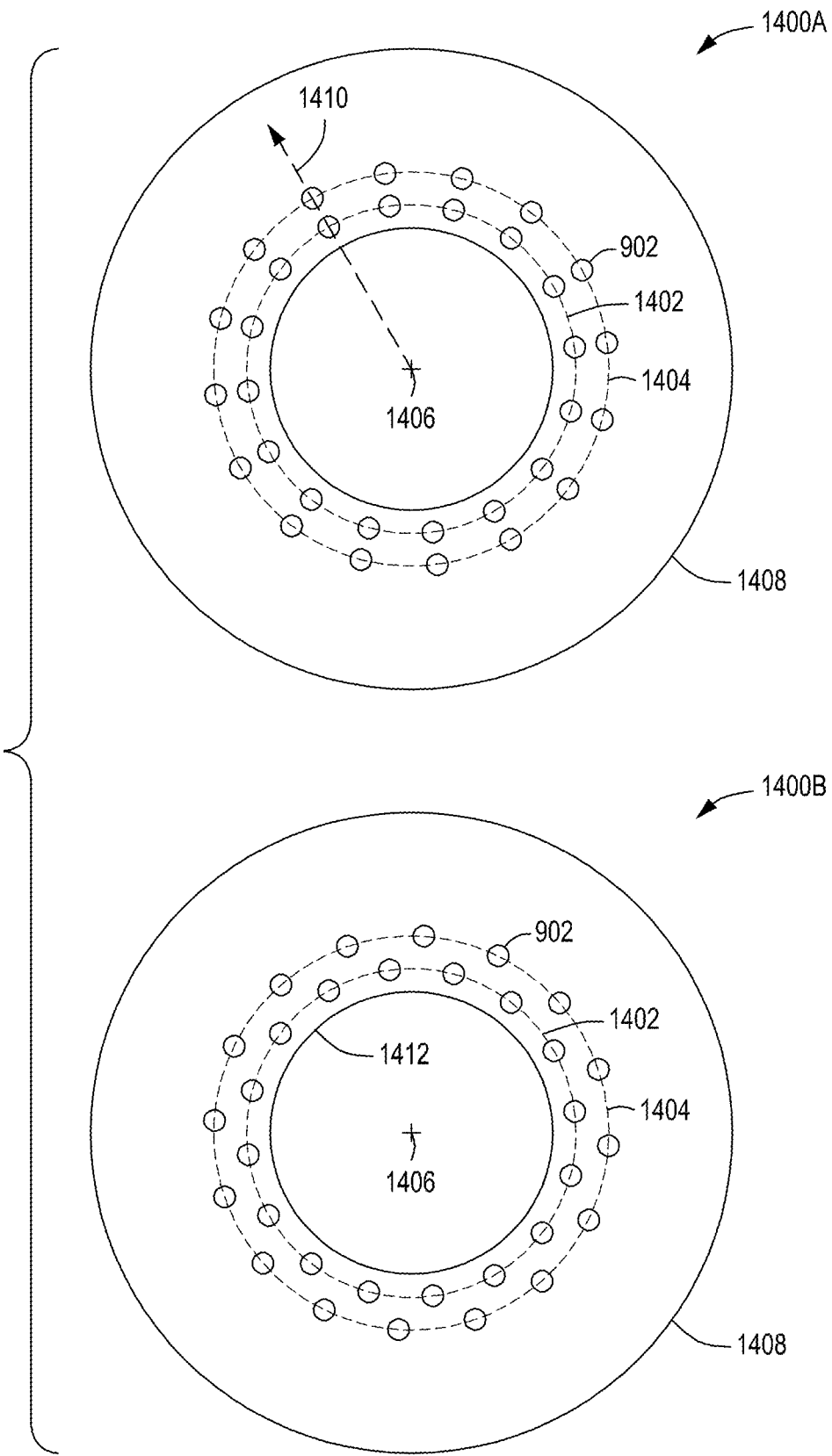
FIG. 14 depicts bottom-up views of covers with sloping surfaces and extensions with alternative patterns of capillary holes for remote plasma sources in accordance with some embodiments of the present principles.

Under high pressure conditions, the plasma sheath will have a smaller thickness than under low pressure conditions. The diameter size of the capillary holes 902 will depend on the operating conditions (e.g., pressure, etc.) for a particular RPS design. The distance 906 between the inner edge of the cover 602 with the extension 802 and the center point of the diameter 908 of the capillary holes 902 may be as small as possible while still allowing for ignition of the plasma within the symmetric hollow cavities of the symmetric electrodes. If the distance 906 is too great, ignited plasma near the capillary holes 902 will not be close enough to ignite the plasma in the hollow cavities of the electrodes. FIG. 10, in a bottom view 1000, depicts equal spacing of the capillary holes 902 around an inner edge of the cover 602 with extension 802. In some embodiments, the number of capillary holes 902 may be eight or greater. The more capillary holes 902, the easier the plasma ignition. Manufacturability, however, may limit the number of capillary holes that can be made in a given ceramic material. Large numbers of holes may thin down the wall thickness 910 between capillary holes 902 until a loss of integrity occurs or the ceramic material becomes too thin to maintain integrity under operating conditions. In FIG. 14, a first bottom-up view 1400A depicts a first annular row 1402 of capillary holes and a second annular row 1404 of capillary holes that radiate outward 1410 from a center point 1406 of a cover 1408. In some embodiments, the cover 1408 may have more than two annular rows of capillary holes. In a second view 1400B of FIG. 14, the first annular row 1402 of capillary holes and the second annular row 1404 of capillary holes are offset to allow a denser distribution of holes closer to an inner edge 1412 of the cover 1408. In some embodiments, the cover 1408 may have more than two offset annular rows of capillary holes. In some embodiments, the cover 1408 may have multiple annular rows with a mixture of offset and radially aligned capillary holes. In some embodiments, each of the annular rows may have different diameters of capillary holes. In some embodiments, a single annular row may have different diameters of capillary holes.

Figure 11:
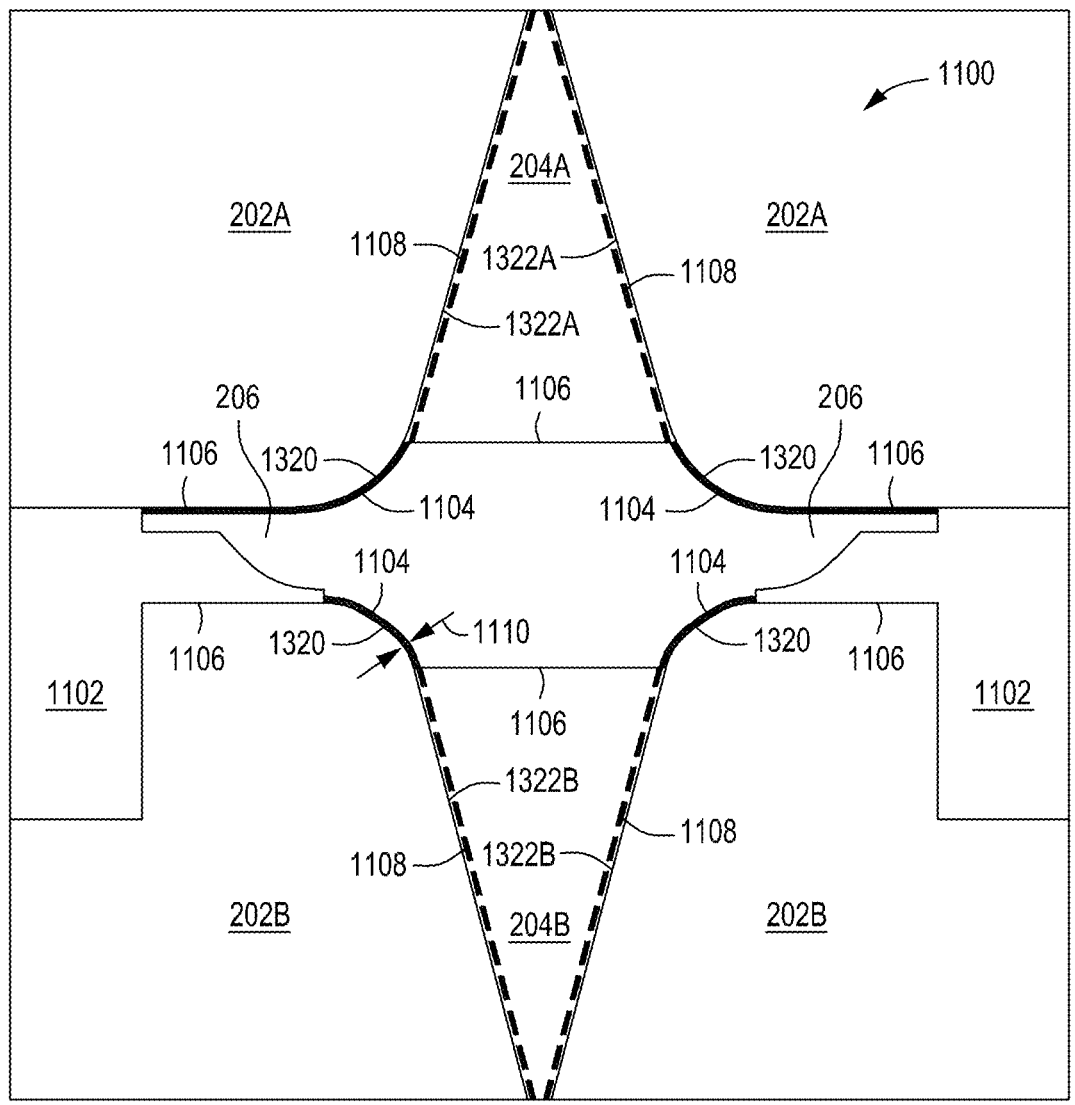
FIG. 11 depicts a cross-sectional view of a plasma source with symmetric electrodes with an yttria coating and a cover with a sloping surface in accordance with some embodiments of the present principles.

The upper symmetric electrode 202A and the lower symmetric electrode 202B as depicted in a view 1100 of FIG. 11 may be formed of an aluminum material with an electroless nickel plating (ENP). An ENP process forms a layer of nickel on the surfaces of the electrodes to prevent chemical reactions that occur during etching or other processes. The chemical reactions may include, but are not limited to, fluorine-based reactions such as aluminum fluoride which is generated by etching process gases such as, but not limited to, nitrogen trifluoride ($NF_3$) and the like. However, the nickel coating often causes particulates that may end up on substrates and cause performance issues with the substrate features. The inventors have found that by applying an additional yttria ($Y_2O_3$) coating 1104 on the ENP on high electric field areas of the symmetrical electrode RPS, the yttria coating 1104 will increase the impedance of the gap 206 to allow more power to be supplied to the hollow cathode discharge while preventing nickel sputtering that can deposit on top of ceramic surfaces within the gap 206, reducing the impedance of the gap 206. The yttria coating 1104 also facilitates to prevent chemical reactions that occur during etching or other processes such as, but not limited to, fluorine-based reactions which are generated by etching process gases such as, but not limited to, nitrogen trifluoride ($NF_3$) and the like. In some embodiments, the yttria coating 1104 is approximately 100 mills in thickness 1110.

Because the yttria coating 1104 extends down at least partially into the mouth of the hollow cavity, the plasma performance is further enhanced such as increased etch rates and the like depending on how the RPS is being used. Yttria-based particles, if generated, cannot cause arcing and shorting by building up in the gap area because the yttria particles are not conductive like the nickel particles. In some embodiments as depicted in FIG. 11, the yttria coating 1104 is applied to the surface 1320 of the second cone section 1316 (see, FIG. 13) and to at least a portion of the parallel surfaces 1106 of the gap 206 that would be exposed to plasma during operation. In some embodiments, the yttria coating 1104 may extend to cover most or all of the parallel surfaces 1106 to make manufacturing of the coated electrodes easier. The inventors have found that the yttria coating 1104 may be extended 1108 onto a first cone section surface 1322A (see, FIG. 13) of the upper symmetric hollow cavity 204A and onto a first cone section surface 1322B of the lower symmetrical hollow cavity 204B. By extending the yttria coating 1104 into the hollow cavities, the yttria coating 1104 will prevent nickel sputtering from occurring inside of the hollow cavities and increase particle performance (i.e., reduce the number of particles generated) of the RPS, especially nickel-based particles.

In some embodiments, a cover, a cover with an extension, or a cover with an extension and capillary holes may be used in conjunction with the yttria coating 1104 as also depicted in FIG. 11. In some embodiments, a unitary assembly 1102 as depicted in FIG. 11 may be used in an RPS with or without the yttria coating 1104. the unitary assembly 1102 incorporates a cover and an insulator into a single unitary piece for ease of placement and assembly. The unitary assembly 1102 is also less costly to manufacture as a single part. Although the unitary assembly 1102 is shown with an isolator portion only extending into the lower symmetric electrode 202B, as depicted in FIG. 3, the unitary assembly 1102 may include an isolator portion extending into both the upper symmetric electrode 202A and the lower symmetric electrode 202B in some embodiments.

While the foregoing is directed to embodiments of the present principles, other and further embodiments of the principles may be devised without departing from the basic scope thereof.

The invention claimed is:

1. An apparatus for processing a substrate, comprising:
a process chamber with a chamber body enclosing a processing volume;
a remote plasma source (RPS) having a plasma source with an upper electrode and a lower electrode, wherein the upper electrode and the lower electrode are symmetrical with hollow cavities configured to induce a hollow cathode effect within the hollow cavities, wherein the upper electrode and the lower electrode are electrically separated by a first gap with an annular dielectric cover positioned within the first gap, wherein the annular dielectric cover is in direct contact with the lower electrode and forms a second gap between an uppermost surface of the annular dielectric cover and a lowermost surface of the upper electrode, wherein the annular dielectric cover fills approximately 50% to approximately 95% of a height of the first gap, and wherein the RPS is configured to provide radicals or ions into the processing volume; and
a radio frequency (RF) power source configured to provide a symmetrical driving waveform on the upper electrode and the lower electrode to produce an anodic cycle and a cathodic cycle of the RPS, wherein the anodic cycle and the cathodic cycle operate in a hollow cathode effect mode.

2. The apparatus of claim 1, wherein the annular dielectric cover is a ceramic material.

3. The apparatus of claim 1, wherein the annular dielectric cover has an outermost edge with a first thickness and an innermost edge with a second thickness less than the first thickness.

4. The apparatus of claim 3, wherein the second thickness is approximately 1 millimeter to approximately 2 millimeters and the first thickness is less than approximately 95% of the height of the first gap.

5. The apparatus of claim 3, wherein the first thickness slopes downward into a third thickness equal to the second thickness before reaching the innermost edge.

6. The apparatus of claim 1, wherein the annular dielectric cover has an inner diameter greater than an outer edge of an opening of the hollow cavities.

7. The apparatus of claim 1, wherein the annular dielectric cover has an inner diameter smaller than an outer edge of an opening of the hollow cavities and wherein an innermost edge of the annular dielectric cover extends, at least partially, into the opening.

8. The apparatus of claim 7, wherein capillary holes are spaced in proximity of the innermost edge of the annular dielectric cover.

9. The apparatus of claim 8, wherein the capillary holes have a diameter of less than two times a thickness of a sheath of plasma to be generated with the RPS.

10. The apparatus of claim 1, wherein the upper electrode and the lower electrode are plated with electroless nickel plating.

11. The apparatus of claim 10, wherein an yttria coating is applied to plasma exposed surfaces of the upper electrode and the lower electrode.

12. The apparatus of claim 10, wherein an yttria coating is applied to plasma exposed surfaces with the first gap and in proximity of openings of the hollow cavities of the upper electrode and the lower electrode.

13. An apparatus for processing a substrate, comprising:
a remote plasma source (RPS) having a plasma source with an upper electrode and a lower electrode, wherein the upper electrode and the lower electrode are symmetrical with hollow cavities configured to induce a hollow cathode effect within the hollow cavities, wherein the upper electrode and the lower electrode are electrically separated by a first gap with an annular dielectric cover positioned within the first gap, wherein the annular dielectric cover is in direct contact with the lower electrode and forms a second gap between an uppermost surface of the annular dielectric cover and a lowermost surface of the upper electrode, wherein the annular dielectric cover fills approximately 50% to approximately 95% of a height of the first gap, and wherein the RPS is configured to provide radicals or ions; and
a radio frequency (RF) power source configured to provide a symmetrical driving waveform on the upper electrode and the lower electrode to produce an anodic cycle and a cathodic cycle of the RPS, wherein the anodic cycle and the cathodic cycle operate in a hollow cathode effect mode.

14. The apparatus of claim 13, wherein the annular dielectric cover has an outermost edge with a first thickness and an innermost edge with a second thickness less than the first thickness and wherein the second thickness is approximately 1 millimeter to approximately 2 millimeters and the first thickness is less than approximately 95% of the height of the first gap.

15. The apparatus of claim 14, wherein the first thickness slopes downward into a third thickness equal to the second thickness before reaching the innermost edge.

16. The apparatus of claim 13, wherein the annular dielectric cover has an inner diameter greater than an outer edge of an opening of the hollow cavities or wherein the annular dielectric cover has an inner diameter smaller than an outer edge of an opening of the hollow cavities and wherein an innermost edge of the annular dielectric cover extends, at least partially, into the opening.

17. The apparatus of claim 16, wherein capillary holes are spaced in proximity of the innermost edge of the annular dielectric cover and wherein the capillary holes have a diameter of less than two times a thickness of a sheath of plasma to be generated with the RPS.

18. The apparatus of claim 13, wherein the upper electrode and the lower electrode are plated with electroless nickel plating and wherein an yttria coating is applied to plasma exposed surfaces of the upper electrode and the lower electrode on the electroless nickel plating.

19. An apparatus for providing a remote plasma source (RPS) for generating etchants, comprising:

an upper electrode with a first hollow cavity configured to induce a hollow cathode effect within the first hollow cavity;

a lower electrode with a second hollow cavity configured to induce a hollow cathode effect within the second hollow cavity, wherein the first hollow cavity and the second hollow cavity are symmetrical;

a first gap positioned between and electrically separating the upper electrode and the lower electrode; and an annular dielectric cover in direct contact with the lower electrode in the first gap and forms a second gap between an uppermost surface of the annular dielectric cover and a lowermost surface of the upper electrode, wherein the annular dielectric cover fills approximately 50% to approximately 95% of a height of the first gap, wherein the annular dielectric cover has an inner diameter smaller than an outer edge of an opening of the second hollow cavity which extends, at least partially, into the opening while directly in contact with a surface of the second hollow cavity, and wherein capillary holes are spaced in proximity of an innermost edge of the annular dielectric cover and have a diameter of less than two times a thickness of a sheath of plasma to be generated with the RPS.

20. The apparatus of claim 19, wherein the upper electrode and the lower electrode are plated with electroless nickel plating and an yttria coating is applied to plasma exposed surfaces of the upper electrode and the lower electrode over the electroless nickel plating.

* * * * *